US011398726B2

(12) United States Patent
Zimmermann (10) Patent No.: US 11,398,726 B2
(45) Date of Patent: Jul. 26, 2022

(54) METHOD FOR IDENTIFYING SWITCH TOPOLOGIES IN ENERGY STORAGE SYSTEMS

(71) Applicant: Technische Universität München, Munich (DE)

(72) Inventor: Thomas Zimmermann, Munich (DE)

(73) Assignee: Technische Universität München, Munich (DE)

( * ) Notice: Subject to any disclaimer, the term of this patent is extended or adjusted under 35 U.S.C. 154(b) by 286 days.

(21) Appl. No.: 16/031,014

(22) Filed: Jul. 10, 2018

(65) Prior Publication Data
US 2019/0020195 A1      Jan. 17, 2019

(30) Foreign Application Priority Data
Jul. 13, 2017   (DE) ...................... 10 2017 115 808.1

(51) Int. Cl.
*H02J 1/00* (2006.01)
*G01R 19/165* (2006.01)
*H02J 7/00* (2006.01)
*G01R 31/396* (2019.01)

(52) U.S. Cl.
CPC .......... *H02J 1/00* (2013.01); *G01R 19/16538* (2013.01); *G01R 31/396* (2019.01); *H02J 7/0021* (2013.01); *H02J 7/0024* (2013.01); *H02J 7/0047* (2013.01)

(58) Field of Classification Search
CPC .......... H02J 1/00; H02J 7/0021; H02J 7/0024; H02J 7/0047; G01R 19/165; G01R 19/165138; G01R 31/396

USPC ......................................................... 320/117
See application file for complete search history.

(56) References Cited

U.S. PATENT DOCUMENTS

| | | | | |
|---|---|---|---|---|
| 7,571,683 | B2* | 8/2009 | Kumar ............... | B60L 50/16 105/35 |
| 2009/0102424 | A1* | 4/2009 | Tien ..................... | H02J 7/0014 320/124 |
| 2009/0146610 | A1* | 6/2009 | Trigiani ............... | H02J 7/0014 320/119 |
| 2010/0327815 | A1* | 12/2010 | Johnson .............. | H01M 10/482 320/136 |
| 2011/0140533 | A1* | 6/2011 | Zeng ................... | H02J 7/0021 307/80 |
| 2012/0286794 | A1* | 11/2012 | Firehammer ........ | H02J 7/0016 324/434 |
| 2015/0147595 | A1* | 5/2015 | Klausner .............. | H02P 27/06 429/7 |

* cited by examiner

*Primary Examiner* — Richard Isla
*Assistant Examiner* — Dung V Bui
(74) *Attorney, Agent, or Firm* — Budzyn IP Law, LLC (57) ABSTRACT

A method for identifying the switch topology of multiple energy storage module connected in parallel and/or in series, which respectively have at least one energy storage element, each module has a switch element for selectively activating and deactivating the module and a unique identifier, wherein each module is assigned to a module string in that a total current flowing across the switch topology is checked, and individual modules are activated successively via the switch element until the total current is detectable.

15 Claims, 8 Drawing Sheets

METHOD FOR IDENTIFYING SWITCH TOPOLOGIES IN ENERGY STORAGE SYSTEMS

FIELD OF THE INVENTION

The invention relates to a method for identifying the switch topology of multiple energy storage modules that are connected in parallel and/or in series, each having at least one energy storage element.

BACKGROUND

Electrical energy storage systems (EES) generally have many individual energy storage elements which are connected to one another according to a predetermined switch topology. The switch topology arranges the serial connection of multiple energy storage elements into a module string according to the desired output voltage. To increase storage capacity and/or to increase the maximum current, multiple energy storage elements or module strings may also be connected in parallel.

In the automotive sector, such EESs are used, for example, in hybrid vehicles or in pure electric vehicles.

Beginning at a reduction of the storage capacity to 80% with regard to the initial storage capacity (nominal capacity), the EESs become uninteresting for use in vehicles due to the accompanying reduction in travel range. However, these energy storage systems may still be used in so-called second life applications, in which the installation space and the weight may be disregarded. One possible second life example is stationary energy stores, which function for network support or to provide self-sufficiency for individual houses or entire localities. For this purpose, the EESs are disassembled and characterized down to the level of the individual energy storage elements. The energy storage elements are subsequently assembled into a new EES based on the identified cell parameters and supplied to the second life application. Problems often occur thereby in that the switch topology is not known or must be exhaustively determined.

Previously, the determination of the switch topology was carried out during the design of the EES. During the assembly and commissioning, an associated control unit is parameterized corresponding to the switch topology.

In addition, dynamically adaptable (dynamically reconfigurable) EESs are known from research, in which the switch topology may be modified to a certain extent during operation and adjusted depending on the application. In this case, further information about the switch topology is necessary for the control unit.

No automated identification of the switch topology was previously known. A new parameterization of the control unit during a change of the switch topology is thus time consuming and expensive. The change of the switch topology may thereby occur in a desired or undesired way according to the reasons mentioned above, for example, due to defects in the electrical connections of the energy storage system.

The object of the present invention is to enable an automated identification of the switch topology of an EES comprising multiple energy storage elements.

SUMMARY OF THE INVENTION

This problem is solved by the invention defined in the independent claims. Advantageous embodiments are derived from the subclaims.

According to the invention, a method is proposed to identify the switch topology of multiple energy storage modules connected in parallel and/or in series, in that each module has a switch element for selective activation and deactivation of the module and a unique identifier, a module string comprising at least one module is identified, in that a total current flowing across the switch topology is checked and individual modules are activated successively until the total current is detectable.

Thus, the modules may be individually activated and deactivated. By checking the total current, the information affecting the switch topology may be determined. Thus, for example, it may be determined which modules are activated when the total current is detectable. In such a way, it may be determined which modules belong to a module string by using the unique identifier of the modules. The invention thus enables automated identification of the switch topology.

In one embodiment of the method according to the invention, an activated module may be deactivated to identify the module string, and the total current may be checked following the deactivation, and the deactivated module remains deactivated if the total current remains detectable following the deactivation, and the deactivated module is reactivated if the total current is no longer detectable following the deactivation.

This embodiment has the advantage that the deactivated module is then only assigned to the identified module string if it is necessary for the detectability of the total current, that means, for the current flow across the identified module string.

In another embodiment of the method according to the invention, the activated modules may be deactivated successively to identify the module string, and the total current may be checked following each deactivation, and a deactivated module remains deactivated if the total current remains detectable following the deactivation, and a deactivated module is reactivated if the total current is no longer detectable following the deactivation, until each activated module has been deactivated at least once.

This embodiment has the advantage that each activated module is then only assigned to the identified module string if it is necessary for the detectability of the total current, that means, for the current flow across the identified module string. In other words, a unique module string is determined in this way, comprising only modules without whose activation no current flow is possible across the identified module string.

In another embodiment of the method according to the invention, each module may have current detecting means for determining the module current, and a module current flowing across the module is checked for each of the activated modules and, if the total current is detectable, the modules are deactivated across which no module current flows. The determination of the module current may thereby comprise the measurement of the module current and/or the detection of the presence of a module current.

In this way, the modules which are not part of the unique module string, i.e., a total current remains detectable following their deactivation, may be identified and deactivated more quickly. It is obvious that a module, across which no module current flows, is not part of an activated unique module string if a total current is detectable. An activated module string is thereby a module string in which all associated modules are activated. If the switch topology does not comprise modules connected in parallel, all modules that are not part of the unique module string may be deactivated in this way.

In another embodiment of the method according to the invention, the identification of a module string may be repeated until all modules are assigned to at least one module string.

This has the advantage that all modules are used for identifying a module string or multiple module strings in order to take all modules of the energy storage system into account during the identification of the switch topology. Furthermore, by this means multiple possible module strings may be identified by the switch topology. In such a way, alternative module strings may be activated, for example, if changed demands require this. In addition, the loss of a module, for example, caused by a defect, may thus be compensated for by activating an alternative module string.

In another embodiment of the method according to the invention, the modules of one module string may be activated and all other modules deactivated; modules connected in parallel to the module string are identified in that another module, which is not part of the module string, is activated and a module of the module string is deactivated; the total current is checked; and the deactivated module of the module string is reactivated.

By this means, it may be checked with regard to a unique module string, in particular with regard to an individual module of a unique module string, whether the additional module, which is not part of the unique module string, is connected in parallel to the individual module and thus to the unique module string. This has the advantage, for example, that individual modules of a module string may be exchanged when these are connected in parallel to one another. In other words, a module may be deactivated in an activated module string if a module connected in parallel is activated, without changing the activation state of the module string by this means. Furthermore, as described at the outset, it may be advantageous to activate modules connected in parallel.

In another embodiment of the method according to the invention, the identification of the modules connected in parallel may be repeated for each module of the module string.

By this means, it may be checked for each module of the unique module string, whether the additional module, which is not part of the unique module string, is connected in parallel to the module of the unique module string.

In another embodiment of the method according to the invention, the identification of the modules connected in parallel may be carried using each module which is not part of the module string.

In this way, the identification of modules connected in parallel may be carried out for additional modules in order to contribute to the complete identification of the switch topology or an identification of the switch topology sufficient for a specific application.

In another embodiment of the method according to the invention, the method may be repeated for each module string.

A complete identification of the switch topology may be thus enabled. In other words, all modules connected in series and/or in parallel to each module may be thus identified.

In another embodiment of the method according to the invention, the modules may be sorted based on the unique identifier and the activation and deactivation may be carried out corresponding to the sorting.

This may have the advantage of accelerating the automated method. Furthermore, the sequence, in which the modules are activated and/or deactivated, may be adjusted depending on the demands.

In another embodiment of the method according to the invention, all modules may be activated at the beginning and/or at the conclusion of the method.

In such a way, following the identification of a module string, all of the modules belonging to it may be deactivated again in order to identify a new module string by repeating the method. In other words, the method may thus be repeated without taking the modules that are already assigned to a module string into account.

Furthermore, following the identification of the modules connected in parallel to the modules of a unique module string, the modules of the unique module string may be deactivated again in order to identify the modules connected in parallel to the modules of another unique module string by repeating the method.

Thus, this embodiment provides the advantage that the same starting point always underlies the method during the repetition of the method, by which means the method may be accelerated and the automation of the method may be simplified.

It is proposed according to the invention for an energy storage system comprising at least two energy storage modules, which are connected to one another according to a switch topology, and two electrical terminals, with which the energy storage modules may be electrically contacted, that each energy storage module has an energy storage element and a switch element, through which the energy storage module is selectively activatable or deactivatable, and the energy storage system has at least one current detecting means for determining the total current, and the energy storage system comprises a control circuit that is designed for carrying out a method specified above.

Such an energy storage system has the advantage that the modules may be individually activated and deactivated by the control circuit. By checking the total current, the information affecting the switch topology may be transmitted to the control circuit. Thus, for example, it may be transmitted which modules are activated when the total current is detectable. In such a way, the control circuit may determine which modules belong to a module string using the unique identifier of the modules.

Furthermore, due to a bidirectional communication between the control circuit and the individual modules, information, for example control commands, may be transmitted from the control circuit to the individual modules and information, for example signal states, the activation state, or measured values, may be transmitted from the individual modules to the control circuit. The transmission of information may thereby be carried out at fixed intervals, at specified points in time, or at any other arbitrary or specified points in time.

Such an energy storage system thus has the advantage that the switch topology of the energy storage system may be automatically identified according to one of the methods described above. Furthermore, such an energy storage system provides the advantage that the module current of an energy storage module may be determined, by which means the identification of specific switch topologies may be enabled and/or accelerated.

In one embodiment of the energy storage system according to the invention, each energy storage module may have current detecting means for determining the module current.

Due to this embodiment, for example, the module currents of multiple energy storage modules may be simultaneously determined. By this means, the methods described above for identifying the switch topology of the energy storage system may be accelerated. Furthermore, the compatibility of the energy storage module with other energy storage systems may be achieved or improved.

BRIEF DESCRIPTION OF THE DRAWINGS

Exemplary embodiments of the invention will be subsequently described in greater detail by means of the associated figures. As shown in.

DETAILED DESCRIPTION OF THE INVENTION

Figure 1:
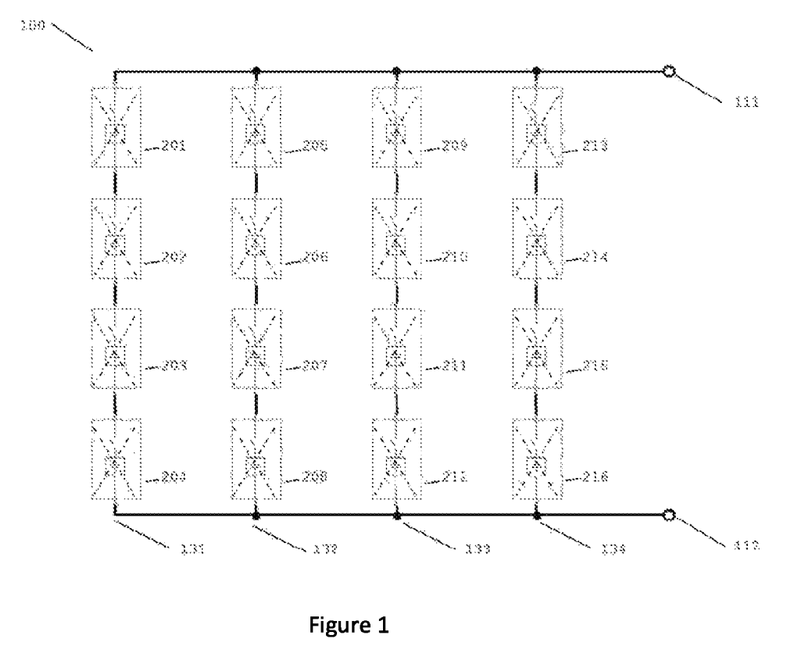
FIG. 1 an energy storage system comprising sixteen energy storage modules with a switch topology without cross connections.

FIG. 1 shows an energy storage system comprising sixteen energy storage modules 201-216. Each energy storage module has one energy storage element and one switch element with which the module is selectively activatable or deactivatable. All modules are deactivated in the example shown. The switch element may be controllable by a control circuit (not shown). Each energy storage module or each switch element additionally has a unique identifier, via which the energy storage module is addressable or identifiable, for example by the control circuit.

The individual energy storage modules are connected among one another according to a predetermined switch topology 100. In the example, four energy storage modules in each case are connected with one another in series into a module string. The energy storage system has four of these module strings, which are each connected in parallel. Thus, energy storage modules 201, 202, 203, and 204 form module string 131 and energy storage modules 205, 206, 207, and 208 form module string 132, etc.

Energy storage system 100 has two electrical terminals 111 and 112, between which the module strings lie.

Figure 2A:
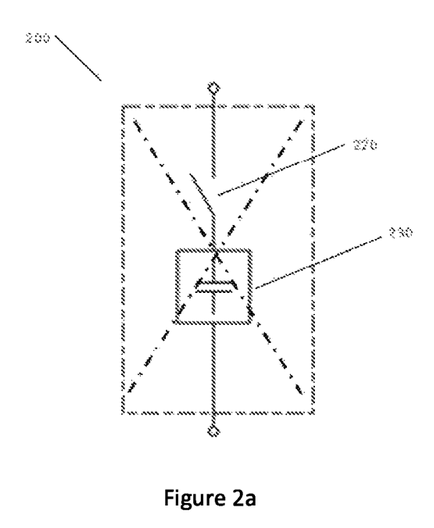
FIG. 2a a deactivated energy storage module.

FIG. 2a shows a deactivated energy storage module 200, which comprises an energy storage element 230 and an open switch element 220. Energy storage module 200 may be activated or deactivated by closing or opening switch element 220. No module current may flow through the open position of switch element 220 across deactivated energy storage module 200.

Figure 2B:
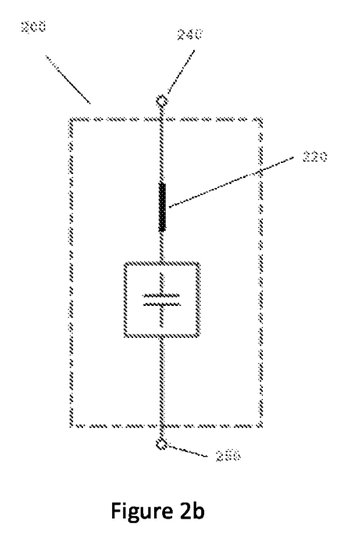
FIG. 2b an activated energy storage module.

FIG. 2b shows energy storage module 200 with closed switch element 220. Due to the closed position of switch element 220, energy storage module 200 is activated and a module current may flow between electrical terminals 240 and 250 of the energy storage module.

Figure 3:
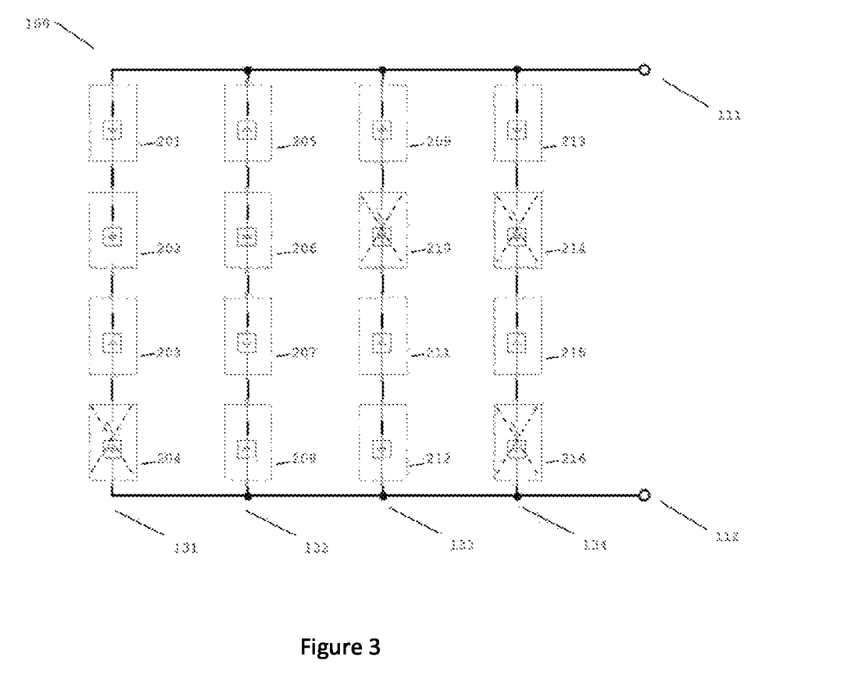
FIG. 3 the energy storage system from FIG. 1 with partly activated and partly deactivated energy storage modules.

FIG. 3 shows the energy storage system from FIG. 1 with switch topology 100. In the example, the energy storage module are partly activated and partly deactivated.

Figure 4:
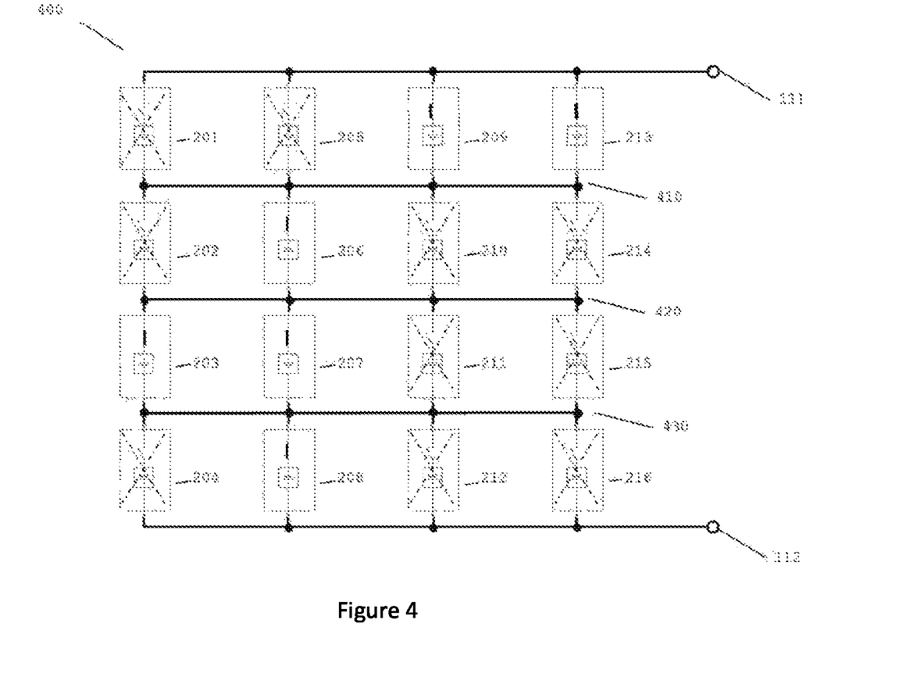
FIG. 4 an energy storage system comprising sixteen energy storage modules with a switch topology with cross connections.

FIG. 4 shows an energy storage system similar to the energy storage systems from FIGS. 1 and 3 comprising sixteen energy storage modules 201-216. Each energy storage module has one energy storage element and one switch element with which the module is selectively activatable or deactivatable. In the example show, the modules are partly activated and partly deactivated.

The individual energy storage modules are connected among one another according to a predetermined switch topology 400. With regard to switch topology 100 from FIG. 1 or 3, switch topology 400 has additional cross connections 410, 420, and 430 between the module strings. In the example, cross connections 410, 420, and 430 are arranged such that in each case four of the sixteen energy storage modules are connected in parallel. Thus, energy storage modules 201, 205, 209, and 213 are connected in parallel by cross connection 410, and energy storage modules 204, 208, 212, and 216 are connected in parallel by cross connection 430. Energy storage modules 202, 206, 210, and 214 are connected in parallel by cross connections 410 and 420, and energy storage modules 203, 207, 211, and 215 are connected in parallel by cross connections 420 and 430.

A plurality of possible module strings result from the sixteen energy storage modules by means of cross connections 410, 420, and 430. Thus, for example, energy storage modules 201-204 may form a module string just like energy storage modules 203, 206, 208, and 209.

Figure 5:
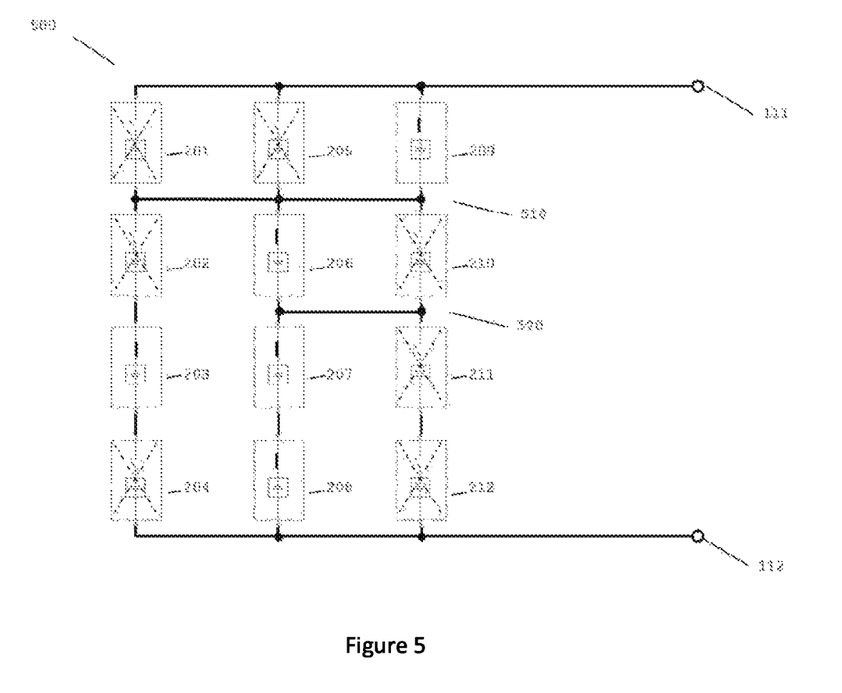
FIG. 5 an energy storage system comprising twelve energy storage modules with a switch topology with cross connections.

FIG. 5 depicts an energy storage system which is similar to the energy storage systems depicted in FIGS. 1, 3, and 4 and consists of twelve energy storage modules 201-212.

The individual energy storage modules are connected among one another according to a predetermined switch topology 500. As in the energy storage systems from FIGS. 1, 3, and 4, energy storage modules 201-204, energy storage modules 205-208, and energy storage modules 209-212 are each connected in series into module strings. Energy storage modules 201, 205, and 209 are additionally connected in parallel by cross connection 510, and energy storage modules 206 and 210 are connected in parallel by cross connections 510 and 520.

The above examples, carried out by way of FIGS. 1-5, show switch topologies of energy storage systems. The number and switching of the energy storage modules are thereby not limited to the examples shown. Any switch topologies of energy storage systems, consisting of any number of energy storage modules, are possible.

Figure 6:
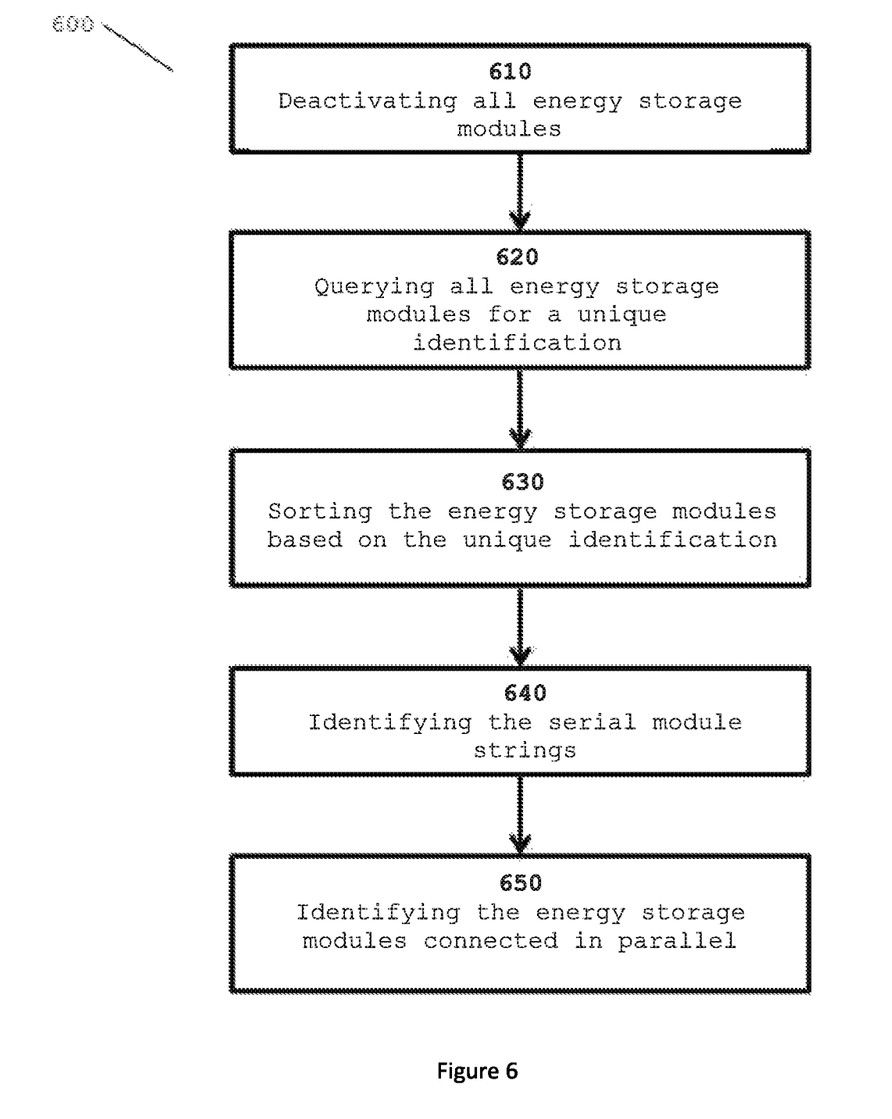
FIG. 6 a flow chart of one embodiment of the method according to the invention for identifying a switch topology.

FIG. 6 shows an embodiment 600 of the method according to the invention for identifying a switch topology, e.g., switch topology 100, switch topology 400, or switch topology 500, in the form of a flow chart. First method step 610 comprises the deactivation of all energy storage modules comprised by the switch topology, by which means the state depicted in FIG. 1 by way of example is achieved.

In second method step 620, the energy storage modules are queried according to a unique identifier. The unique identifier may comprise, e.g. the serial number of the respective energy storage module or an assigned address of the energy storage module within the switch topology.

In a third method step 630, the energy storage modules are sorted by way of their unique identifiers. The sorting may thereby function to activate or deactivate the energy storage modules successively in a defined sequence.

The first activation of the energy storage modules is carried out in subsequent method step 640 in the context of the identification of the serial module strings. For example, module string 131 and module string 132 are identified in switch topology 100, which, as depicted in FIGS. 1 and 3, comprise energy storage modules 201, 202, 203, and 204 or energy storage modules 205, 206, 207, and 208.

Figure 7:
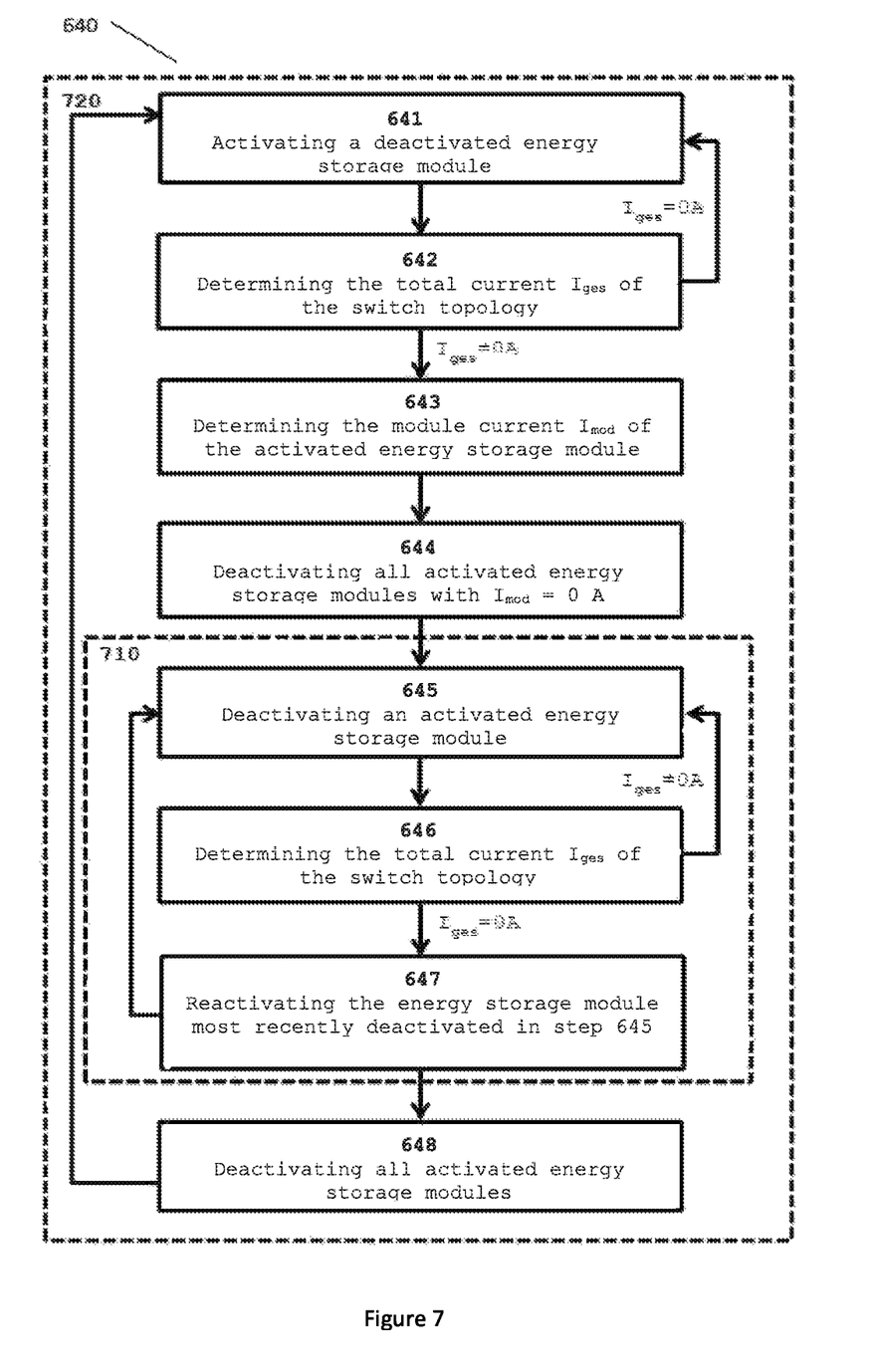
FIG. 7 a flow chart of one embodiment of the method step according to the invention for identifying the serial module strings of the switch topology.

An embodiment of method step 640 according to the invention is shown in FIG. 7.

In the next method step 650, the energy storage modules are identified that are connected in parallel to the energy storage modules which belong to an identified module string. For example, energy storage modules 207, 211, and 215 in switch topology 400 are identified as switched in parallel to energy storage module 203, as is depicted in FIG. 4. Or, energy storage module 206 in switch topology 500 is identified as switched in parallel to energy storage module 210, as is depicted in FIG. 5.

Figure 8:
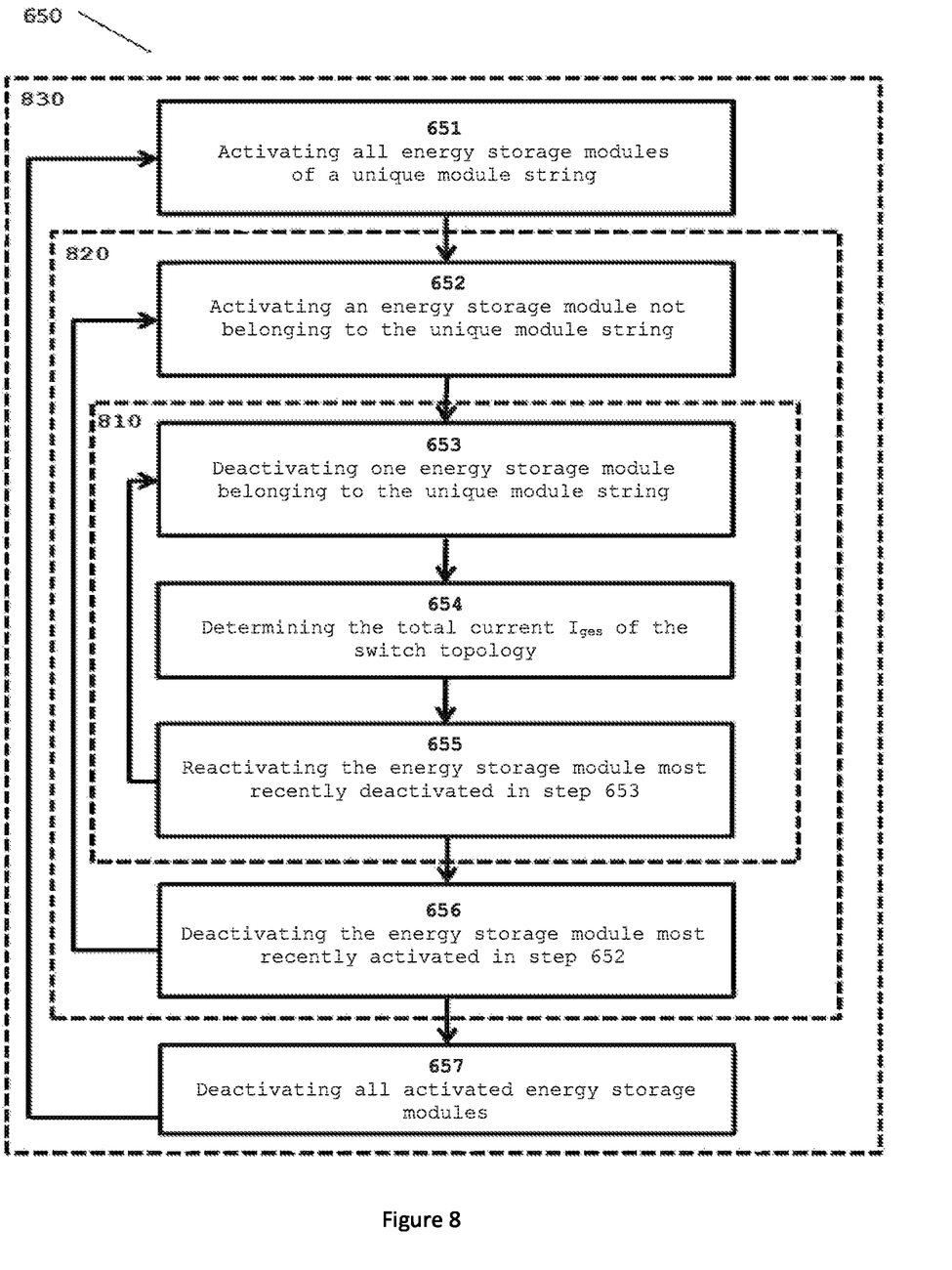
FIG. 8 a flow chart of one embodiment of the method step according to the invention for identifying the energy storage modules connected in parallel of the switch topology.

An embodiment of method step 650 according to the invention is shown in FIG. 8.

FIG. 7 shows the method substeps within method step 640 from FIG. 6 for identifying the serial module strings in a switch topology, for example, in switch topology 100, switch topology 400, or switch topology 500, in the form of a flow chart.

In a first method substep 641, a deactivated energy storage module is activated, and in method substep 642, the total current flowing across the switch topology to be identified is determined. If no total current flow is possible, then method substep 641 is carried out again.

In reference to FIG. 3, for example, energy storage modules 201, 202, 203, 205, 206, 207, 208, 209, 211, 212, 213, and 215 were activated successively according to the embodiment of the method according to the invention for identifying switch topology 100.

In the arrangement of activated and deactivated energy storage modules depicted in FIG. 3, a total current may be measured by applying a voltage across electrical terminals 111 and 112, as all energy storage modules 205, 206, 207, and 208 of module string 132 are activated. Thus, a total current may flow across module string 132. No total current may flow across module strings 131, 133, and 134 as at least one energy storage module is deactivated in each of module strings 131, 133, and 134. Thus, energy storage module 204 is deactivated in module string 131, energy storage module 210 is deactivated in module string 133, and energy storage modules 214 and 216 are deactivated in module string 134.

With regard to FIG. 4, for example, energy storage modules 203, 206, 207, 208, 209, and 213 were activated successively according to the embodiment of the method according to the invention for identification of switch topology 400. By applying an electrical current between electrical contacts 111 and 112, a total current is detectable, as a sufficient number of energy storage modules are activated to form at least one module string, which comprises only activated energy storage modules. For example, activated energy storage modules 209, 206, 203, and 208 and also activated energy storage modules 209, 206, 207, and 208 form a module string which enables the flow of the total current between electrical contacts 111 and 112.

If a total current is possible, then method substep 643 follows, in which the module current is determined for the energy storage modules activated at this point in time.

With regard to FIG. 3, in the embodiment of the method according to the invention, energy storage module 205, 206, 207, and 208 are assigned to module string 132 by the determination of the module currents of the activated energy storage modules, as a current may only flow in an activated energy storage module if all energy storage modules of the module string, which comprises the one energy storage module, are activated. In this way, a module current only flows in the example depicted in energy storage modules 205, 206, 207, and 208. In contrast, no module current flows in activated energy storage modules 201, 202, 203, 209, 211, 212, 213, and 215 through the closed electrical circuit, which lacks one of these energy storage modules.

In addition to energy storage modules connected in series, switch topology 400 in FIG. 4 comprises energy storage modules connected in parallel by means of cross connections 410, 420, and 430. Thus, e.g., energy storage module 209 is connected in parallel to energy storage module 213, and energy storage module 203 is connected in parallel to energy storage module 207. Due to cross connections 410, 420, and 430, a module current is measurable in all of the energy storage modules of the example shown, as soon as four energy storage modules connected in series are activated in at least one of the possible module strings. In this way, a module current is measurable in all activated energy storage modules 203, 206, 207, 208, 209, and 213 in the example upon applying a voltage between electrical contacts 111 and 112.

Activated energy storage modules 209, 213 and 203, 207 connected in parallel of switch topology 400 are identified by measuring the module current, since the module current of an activated energy storage module, which is connected in parallel to another activated energy storage module, is lower than the module current of an activated energy storage module that is not connected in parallel to another activated energy storage module, like energy storage module 206 and 208 in the example, as long as the energy storage modules are identical with regard to their electrical resistance.

In method substep 644, all energy storage modules are deactivated in which no module current flows, and which are thus not part of a unique module string that enables the total current flow. The identification of the switch topology may be accelerated by using method steps 643 and 644. According to the invention, the method for identifying the switch topology of an energy storage system may, however, also be carried out in principal without method steps 643 and 644.

In method substep 645, a still activated energy storage module is deactivated and in method substep 646, the total current flowing across the switch topology to be identified is determined. If a total current flow is possible, then method substep 645 is carried out again. If no total current flow is possible, then in step 647, the reactivation of the energy storage module most recently deactivated in method substep 645 is carried out, at which point method substep 645 is carried out again using another activated energy storage module that has not yet been previously deactivated in method substep 645.

With regard to FIG. 3, the deactivation of an activated energy storage module and the check of the total current determines whether the energy storage module is part of the unique module string in the embodiment of the method according to the invention. Thus, for example, by deactivating energy storage system 201, it checks whether energy storage module 201 is part of unique module string 132. For this purpose, the total current is checked before and after the deactivation of energy storage module 201. Since energy storage module 201 is not part of unique module string 132, the total current remains possible before and after the deactivation of energy storage module 201 and energy storage module 201 remains deactivated. If, e.g., energy storage module 205 is deactivated, then it is determined via electrical contacts 111 and 112 that the flow of the total current is no longer possible, and energy storage module 205 is reactivated.

To identify switch topology 400 is FIG. 4 in the embodiment of the method according to the invention, it checks after the deactivation of one energy storage module whether that energy storage module is connected in parallel to another activated energy storage module, and thus is not part of the unique module string. For this purpose, for example, the total current is rechecked after the deactivation of energy storage module 203. Since the total current also remains possible after the deactivation of energy storage module 203, energy storage module 203 is not part of the unique module string and may remain deactivated. If subsequently energy storage module 206 is deactivated, then it is determined via electrical contacts 111 and 112 that the flow of the total current is no longer possible, and energy storage module 206 is reactivated.

Method loop 710, comprising method substeps 645, 646, 647, is repeated until each of the energy storage modules still activated after method substep 644 is deactivated in method substep 645. In this way, as is obvious to the person skilled in the art, each activated module may be deactivated and, if the flow of the total current is no longer possible due to the deactivation, may be reactivated, until one unique module string consisting of the minimum number of energy storage modules is identified: with regard to FIGS. 1 and 3-5, until one unique module string consisting of four energy storage module is identified. In other words, a module string is identified in such a way, which uses a minimal number of energy storage modules to enable a total current flow across the switch topology to be identified.

In such a way and with reference to FIG. 4, for example, energy storage modules 209 and 203 are deactivated and energy storage modules 213, 206, 207, and 208 are identified as energy storage modules belonging to a unique module string.

Subsequently, all activated energy storage modules are deactivated in method substep 648.

Method loop 720 is repeated until all of the energy storage modules belonging to the switch topology to be identified are assigned to at least one unique module string.

With reference to FIG. 3, all energy storage modules belonging to the identified module string, in the example to module string 132, are deactivated. Through the successive activation of additional, previously not yet assigned energy storage modules until a total current flow is possible, additional module strings are identified. In the example, module strings 131, 133, and 134 are identified according to a procedure, which is obvious to the person skilled in the art and is analogous to the identification of module string 132.

Likewise, with reference to FIG. 4, all energy storage modules 213, 206, 207, and 208 belonging to the uniquely identified module string are deactivated and additional deactivated energy storage modules are activated until a total current is measurable again. As is obvious to the person skilled in the art, in this way all energy storage modules 201-216 are assigned to a unique module string according to an analogous approach.

FIG. 8 shows in the form of a slow chart possible method substeps within method step 650 from FIG. 6 for identifying the energy storage modules connected in parallel to the serial module strings of a switch topology.

In method substep 651, a unique module string identified in module string 640, i.e., all energy storage modules of the unique module string, is activated.

With regard to FIG. 4, in the embodiment of the method according to the invention, following the identification of a specific unique module string, for example, the unique module string comprising energy storage modules 213, 206, 207, and 208, the respective energy storage modules connected in parallel to the energy storage modules of the unique module string are identified, for which purpose energy storage modules 213, 206, 207, and 208 are activated.

Method substep 652 comprises the activation of one energy storage module that does not belong to the unique module string activated in method substep 651, and method substep 653 comprises the deactivation of an energy storage module that belongs to the unique module string activated in method substep 651.

Thus, with reference to FIG. 4, for example, energy storage module 209 is activated and one of energy storage modules 213, 206, 207, and 208 is deactivated.

Subsequently, in method substep 654, the total current flowing across the switch topology to be identified is determined, in order to check whether the energy storage module that does not belong to the unique module string activated in method substep 651 is switched in parallel to the energy storage module deactivated in method step 653.

Thus, with reference to FIG. 4, it is determined by measuring the total current, whether energy storage module 209 is connected in parallel to one of energy storage modules 213, 206, 207, and 208. If, for example, after the activation of energy storage module 209, energy storage module 213 is deactivated, then the total current flow remains possible since energy storage module 213 is connected in parallel to energy storage module 209. If, for example, after the activation of energy storage module 209, energy storage module 206 is deactivated, then the total current flow is no longer possible since energy storage module 206 is not connected in parallel to energy storage module 209.

In method substep 655, the energy storage module deactivated in method substep 653 is subsequently reactivated.

Method loop 810, comprising method substeps 653, 654, and 655, is repeated until each of the energy storage modules which belong to the module string activated in method substep 651, were deactivated in method substep 653.

Subsequently, in method substep 656, the energy storage module activated in method substep 652 is deactivated, and another energy storage module, that does not belong the unique module string activated in method step 651, is activated.

Thus, for example, with regard to FIG. 4, energy storage module 209 is deactivated and energy storage module 203 is activated.

Method loop 820, comprising method substeps 652-656, is repeated until all energy storage modules, that do not belong to the unique module string activated in method substep 651, were deactivated in method substep 652.

As is clear to the person skilled in the art, according to these procedures, each deactivated energy storage module, that does not belong to the specified unique module string, is activated, and one of the energy storage modules belonging to the specified module string is deactivated, and, if the flow of the total current is no longer possible due to the deactivation, the energy storage module is reactivated until all energy storage modules connected in parallel to each of the energy storage modules belonging to the specified unique module string have been identified. In this way, for example in FIG. 4, energy storage modules 204, 212, and 216 are identified as connected in parallel to energy storage module 208.

Subsequently, all energy storage modules are deactivated in method substep 657 and a unique module string is reactivated in method step 651.

In this way, for example with regard to FIG. 4, after the deactivation of all modules, the unique module string comprising modules 209, 206, 203, 208 is activated.

Method loop 830, comprising method substeps 651-657, is repeated until all unique module strings identified in method step 640 have been activated in method substep 651. In this way, all energy storage modules connected in parallel to each of the energy storage modules, which belong to a unique module string of the switch topology to be identified, are identified.

In summary, the present invention describes a method for identifying the switch topology of multiple energy storage module connected in parallel and/or in series, which respectively have at least one energy storage element, each module has a switch element for selectively activating and deactivating the module and a unique identifier, wherein each module is assigned to a module string in that a total current flowing across the switch topology is checked, and individual modules are activated successively via the switch element until the total current is detectable.

The invention claimed is:

1. A method for identifying a switch topology of energy storage modules that are electrically connected in parallel and/or in series to form a plurality of module strings, the plurality of module strings being electrically connected between first and second electrical contacts, each of the energy storage modules having at least one energy storage element, a switch element for selectively activating and deactivating the respective energy storage module, and a unique identifier, via which the respective energy storage module is addressable or identifiable, wherein the method includes the steps of:
i. deactivating the energy storage modules;
ii. activating at least one of the energy storage modules;
iii. measuring a current flow at the first electrical contact
iv. if no current flow is measured, repeating steps ii.-iii.;
v. if current flow is measured, selectively activating and deactivating each of the activated energy storage modules, to determine which of the activated energy storage modules is minimally required to maintain the current flow; and,
vi. identifying the minimally-required activated energy storage modules as a module string forming a portion of the switch topology.

2. The method according to claim 1, wherein
the activated energy storage modules are successively deactivated and the current flow is checked following each deactivation; and
a deactivated energy storage module remains deactivated, if the current flow remains detectable following deactivation, and the deactivated energy storage module is reactivated, if the current flow is no longer detectable following deactivation;
until each of the activated energy storage modules is deactivated at least once.

3. The method according to claim 1, wherein each of the energy storage modules has current detecting means for determining a module current, wherein the module current flowing across the respective energy storage module is checked with the respective energy storage module being activated and, if the current flow is detectable, the energy storage modules, across which no module current flows, are deactivated.

4. The method according to claim 1, wherein an identification of each of the plurality of module strings is repeated until all of the energy storage modules are assigned to at least one of the plurality of module strings.

5. The method according to claim 1, wherein
the energy storage modules of a selected one of the plurality of module strings are activated;
the energy storage modules connected in parallel to the selected module string are identified; in that
another of the energy storage modules, that does not belong to the selected module string, is activated,
and one of the energy storage modules of the selected module string is deactivated;
the current flow is checked;
the deactivated energy storage module of the selected module string is reactivated.

6. The method according to claim 5, wherein an identification of the energy storage modules connected in parallel is repeated for each of the energy storage modules of the selected module string.

7. The method according to claim 6, wherein the method is repeated for each of the plurality of module strings formed by the energy storage modules.

8. The method according to claim 5, wherein an identification of the energy storage modules connected in parallel is repeated for each of the energy storage modules that does not belong to the selected module string.

9. The method according to claim 8, wherein the method is repeated for each of the plurality of module strings formed by the energy storage modules.

10. The method according to claim 1, wherein the energy storage modules are queried according to the unique identifier.

11. The method according to claim 10, wherein the energy storage modules are sorted on the basis of the unique identifier.

12. The method according to claim 11, wherein activation and deactivation of the energy storage modules are carried out corresponding to the sorting.

13. The method according to claim 1, wherein all of the energy storage modules are deactivated at the conclusion of the method.

14. An energy storage system comprising at least two energy storage modules which are connected in parallel and/or in series according to a switch topology, and comprising two electrical terminals with which the energy storage system is electrically contactable, wherein, each of the energy storage modules has one energy storage element and one switch element with which the energy storage modules are selectively activatable or deactivatable; and
the energy storage system has at least current detecting means for determining the current flow; and
the energy storage system comprises a control circuit which is designed to carry out a method according to claim 1.

15. The energy storage system according to claim 14, wherein each of the energy storage modules has current detecting means for determining a module current flowing across the respective energy storage module.

* * * * *